(12) United States Patent
Lin et al.

(10) Patent No.: US 7,985,998 B2
(45) Date of Patent: Jul. 26, 2011

(54) TRENCH-TYPE SEMICONDUCTOR DEVICE STRUCTURE

(75) Inventors: Shian-Jyh Lin, Taoyuan (TW);
Ming-Cheng Chang, Taoyuan (TW);
Neng Tai Shih, Taoyuan (TW);
Hung-Chang Liao, Taoyuan (TW)

(73) Assignee: Nanya Technology Corp., Taoyuan (TW)

( * ) Notice: Subject to any disclaimer, the term of this patent is extended or adjusted under 35 U.S.C. 154(b) by 556 days.

(21) Appl. No.: 12/177,756

(22) Filed: Jul. 22, 2008

(65) Prior Publication Data
US 2009/0166702 A1 Jul. 2, 2009

(30) Foreign Application Priority Data
Jan. 2, 2008 (TW) .................................. 97100111 A

(51) Int. Cl.
*H01L 27/108* (2006.01)
(52) U.S. Cl. ......... 257/301; 257/303; 257/296; 438/243
(58) Field of Classification Search .................. 438/270, 438/268, 259, 243, 301, 302, 303, 386; 257/296–311
See application file for complete search history.

(56) References Cited

U.S. PATENT DOCUMENTS

| | | | | |
|---|---|---|---|---|
| 6,200,873 B1 * | 3/2001 | Schrems et al. | ............... | 438/386 |
| 6,288,422 B1 * | 9/2001 | Mandelman et al. | ......... | 257/301 |
| 6,410,391 B1 * | 6/2002 | Zelsacher | ...................... | 438/259 |
| 6,444,548 B2 * | 9/2002 | Divakaruni et al. | .......... | 438/525 |
| 6,501,117 B1 * | 12/2002 | Radens et al. | ................ | 257/301 |
| 6,576,945 B2 * | 6/2003 | Mandelman et al. | ......... | 257/301 |
| 6,822,281 B2 * | 11/2004 | Voigt et al. | .................... | 257/301 |
| 7,005,341 B1 * | 2/2006 | Wu | ............................... | 438/238 |
| 7,449,382 B2 * | 11/2008 | Chen et al. | .................... | 438/244 |
| 7,459,741 B2 * | 12/2008 | Kidoh et al. | ................... | 257/296 |
| 2005/0083724 A1 * | 4/2005 | Manger et al. | ................ | 365/154 |
| 2006/0076595 A1 * | 4/2006 | Wu | ............................... | 257/296 |
| 2007/0085123 A1 * | 4/2007 | Chou et al. | .................... | 257/301 |
| 2008/0277709 A1 * | 11/2008 | Lee et al. | ...................... | 257/301 |
| 2010/0022065 A1 * | 1/2010 | Lin et al. | ....................... | 438/386 |

FOREIGN PATENT DOCUMENTS
TW 232537 B 5/2005

* cited by examiner

*Primary Examiner* — Steven Loke
*Assistant Examiner* — David Goodwin
(74) *Attorney, Agent, or Firm* — Ingrassia Fisher & Lorenz, P.C.

(57) ABSTRACT

A trench-type semiconductor device structure is disclosed. The structure includes a semiconductor substrate, a gate dielectric layer and a substrate channel structure. The semiconductor substrate includes a trench having an upper portion and a lower portion. The upper portion includes a conductive layer formed therein. The lower portion includes a trench capacitor formed therein. The gate dielectric layer is located between the semiconductor substrate and the conductive layer. The substrate channel structure with openings, adjacent to the trench, is electrically connected to the semiconductor substrate via the openings.

9 Claims, 11 Drawing Sheets

TRENCH-TYPE SEMICONDUCTOR DEVICE STRUCTURE

CROSS REFERENCE TO RELATED APPLICATIONS

This application claims the right of priority based on Taiwan Patent Application No. 097100111 entitled "TRENCH-TYPE SEMICONDUCTOR DEVICE STRUCTURE," filed on Jan. 2, 2008, which is incorporated herein by reference and assigned to the assignee herein.

FIELD OF THE INVENTION

This invention relates to a trench-type semiconductor device structure, and more particularly, to a trench-type semiconductor device by using the channel shielding to avoid floating body effect.

BACKGROUND OF THE INVENTION

As the manufacturing processes of the semiconductor devices are continuously improved, the feature size of the semiconductor device continually reduces to increase the quantity of the devices per area and to improve the capacity and the performance of the devices. For example, a traditional planar metal-oxide-semiconductor field-effect transistor (MOSFET) has been replaced by a trench-type semiconductor device to increase the quantity of the devices per area. However, as the device is scaled down to nano-level, the processes of making the MOSFET encounter many difficulties and problems. For example, as the feature size of the semiconductor device reduces, charges will be captured and accumulated in the channel region due to the interference from the electric field of adjacent transistors, which is also known as floating body effect.

If the problems caused and the size reduce of the device are not overcome, the capacity of the device may not be increased and/or the performance of the device will be negatively affected. Therefore, it is desired to provide a semiconductor device structure and a method for forming the same to avoid floating body effect.

SUMMARY OF THE INVENTION

One aspect of the present invention is to provide a trench-type semiconductor device structure, which has a doped channel layer, so that the accumulated charge can be transferred to the substrate through the doped channel layer to avoid floating body effect.

Another aspect of the present invention is to provide a trench-type semiconductor device structure, wherein the channel width of the vertical transistor can be accurately controlled by using an epitaxial growth method.

Further aspect of the present invention is to provide a trench-type semiconductor device structure, wherein the process of forming a single-sided buried strap structure is performed after the process of forming the trench isolation layer to avoid excessive diffusions of the doped ions.

Still another aspect of the present invention is to provide a trench-type semiconductor device structure, wherein a reversed U-shaped gate dielectric layer slightly covers an epitaxial layer, so that the electric current passing through the epitaxial layer can be increased (i.e. the depletion region is increased).

Another aspect of the present invention is to provide a trench-type semiconductor device structure, wherein the process of forming a vertical transistor is performed after the process of forming a trench isolation layer, so that the damage of the gate dielectric layer can be avoided and the reliability of the device can be enhanced.

In one embodiment, the present invention discloses a trench-type semiconductor device structure, including a semiconductor substrate, a gate dielectric layer and a substrate channel structure. The semiconductor substrate includes a trench having an upper portion and a lower portion. The upper portion includes a conductive layer filled therein, and the lower portion includes a trench capacitor formed therein. The gate dielectric layer is located between the semiconductor substrate and the conductive layer, and formed on a first side of the trench. The substrate channel structure with openings formed on a second side of the trench opposite to the first side and adjacent to the trench, the substrate channel structure being electrically is connected to the semiconductor substrate via the openings.

BRIEF DESCRIPTION OF THE DRAWINGS

FIG. 1 and FIG. 2 illustrate the steps of forming a trench capacitor on a semiconductor substrate in accordance with one exemplary embodiment of the present invention, wherein FIG. 2 is a top view of the semiconductor substrate, and FIG. 1 is a cross-sectional view taken along line A-A' in FIG. 2;

FIG. 3A and FIG. 3B illustrate the steps of forming a vertical channel in the semiconductor substrate in accordance with one exemplary embodiment of the present invention, wherein FIG. 3B is a top view of the semiconductor substrate, and FIG. 3A is a cross-sectional view taken along line A-A' in FIG. 3B;

FIG. 4A and FIG. 4B illustrate the steps of forming a doped channel layer in the semiconductor substrate in accordance with one exemplary embodiment of the present invention, wherein FIG. 4B is a top view of the semiconductor substrate, and FIG. 4A is a cross-sectional view taken along line A-A' in FIG. 4B;

FIG. 5A and FIG. 5B illustrate the steps of the process in accordance with one exemplary embodiment of the present invention, wherein FIG. 5B is a top view of the semiconductor substrate, and FIG. 5A is a cross-sectional view taken along line A-A' in FIG. 5B;

FIG. 6A and FIG. 6B illustrate the steps of forming a single-sided buried strap structure in the semiconductor substrate in accordance with one exemplary embodiment of the present invention, wherein FIG. 6B is a top view of the semiconductor substrate, and FIG. 6A is a cross-sectional view taken along line A-A' in FIG. 6B.

DETAILED DESCRIPTION OF THE INVENTION

Figure 1:
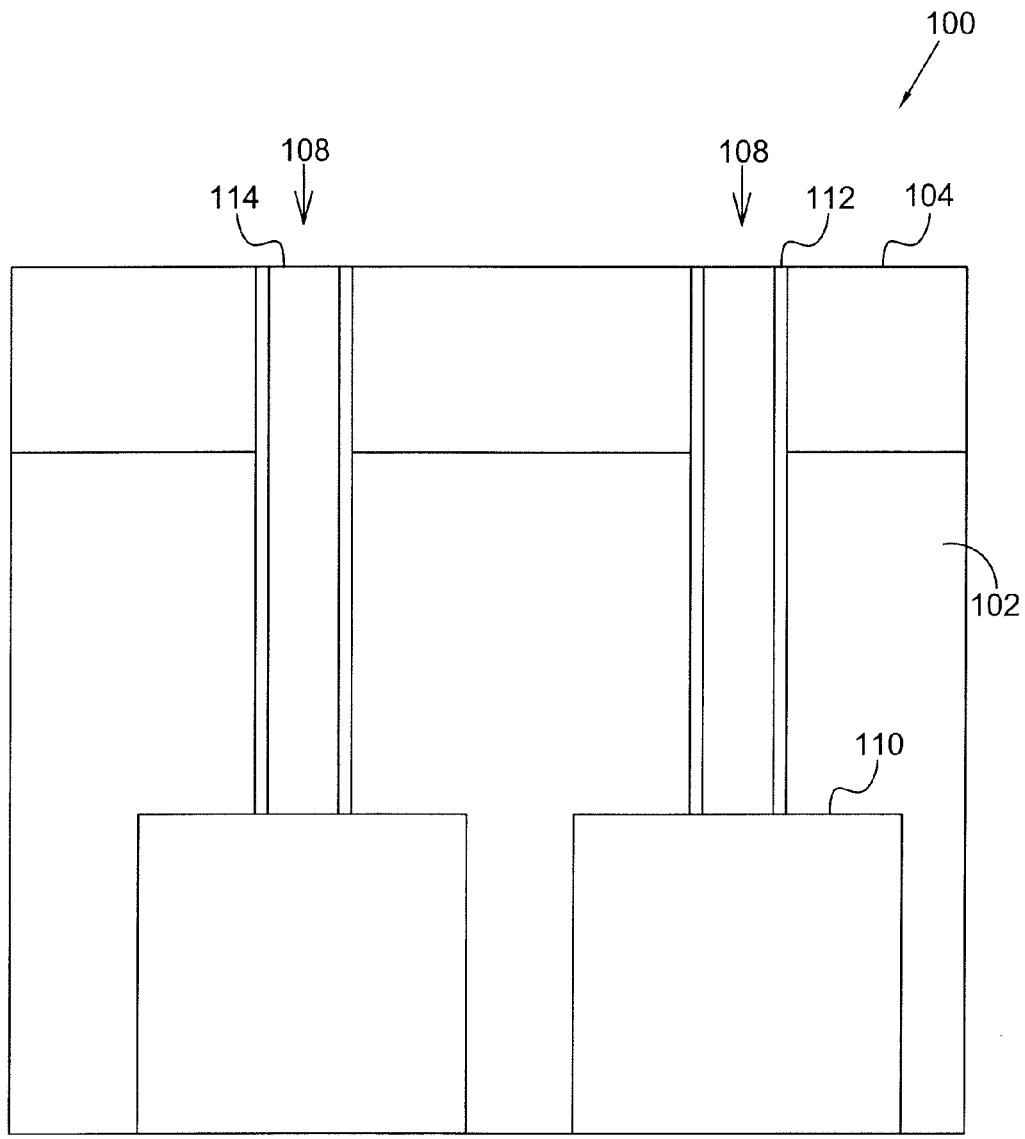
Figure 2:
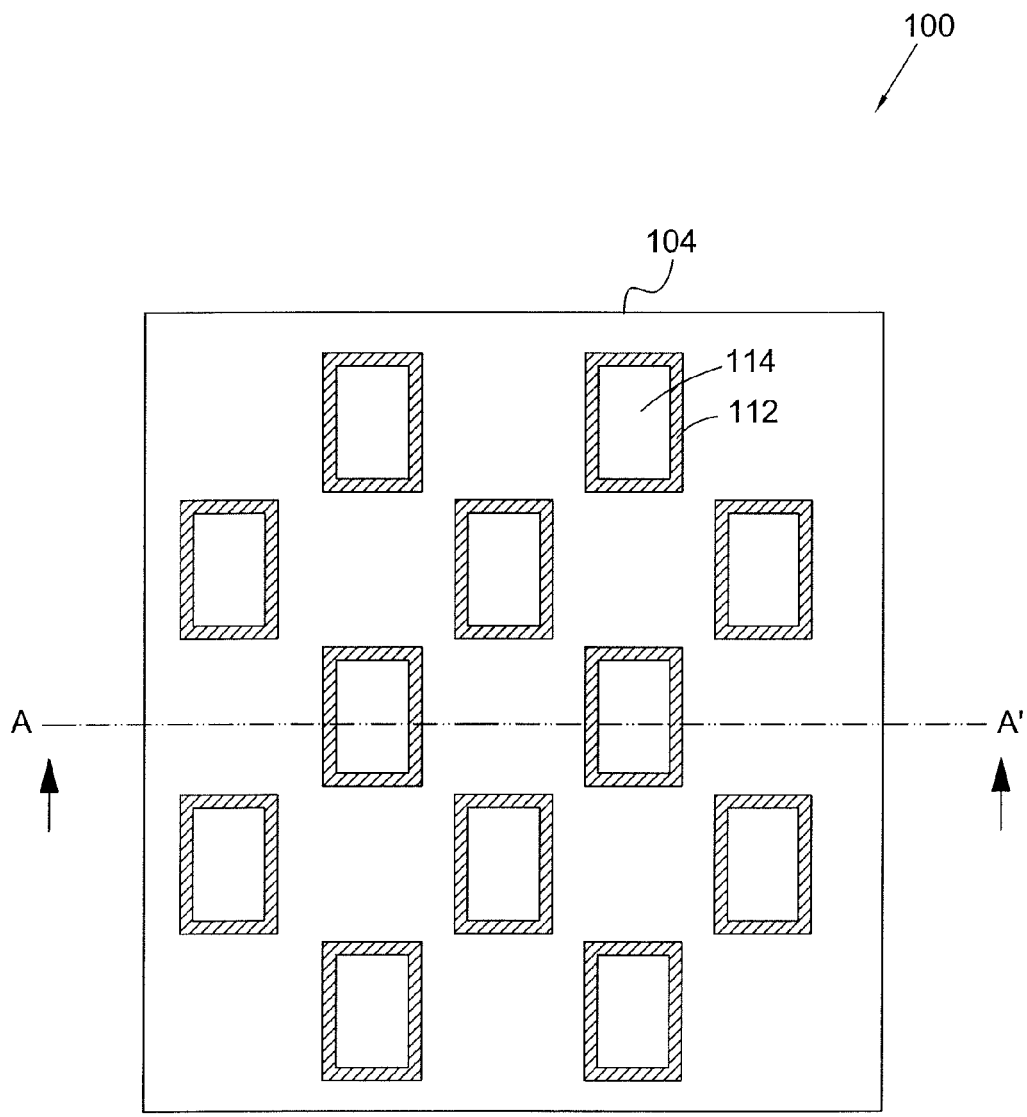

The present invention provides a trench-type semiconductor device structure and a method of forming the same in detail. Referring to FIG. 1 and FIG. 2, the semiconductor substrate 100 is provided, and then a trench 108 is formed in the semiconductor substrate 100. The semiconductor substrate 100 includes a silicon base layer 102 and a pad nitride layer 104 having a thickness of, for example, about 1350 Å. In one embodiment, the material of the silicon base layer 102 can be silicon (Si) or other similar semiconductor materials. The trench 108 has an upper portion and a lower portion. The lower portion of the trench 108 has a trench capacitor 110 formed therein, and the upper portion of the trench 108 has a collar dielectric layer 112 formed on an inner surface of the trench 108 and a conductive layer 114 filled in the trench 108. The conductive layer 114 can be, for example, a polysilicon layer or other conductive material layers. It should be noted that the formation of the trench capacitor 110 in FIG. 1 is conventional in the art. In order to provide a concise and clear description, detailed introduction of how the trench capacitor 110 is formed is not described. For example, in this embodiment, the trench capacitor 110 can be a metal-insulator-silicon (MIS) capacitor, a silicon-insulator-silicon (SIS) capacitor, and so forth. However, the trench capacitor 110 can be other capacitor structures in other embodiments, and the person skilled in the art would know that the trench capacitor 110 may have an electrode layer, a dielectric layer or a storage node.

It should be noted that FIG. 1 shows only two of trenches 108 in FIG. 2 though. Any person skilled in the art will know from the disclosure of FIG. 2 that FIG. 1 functions only as an example of explanation and should not be interpreted in a sense of limitation.

Figure 3A:
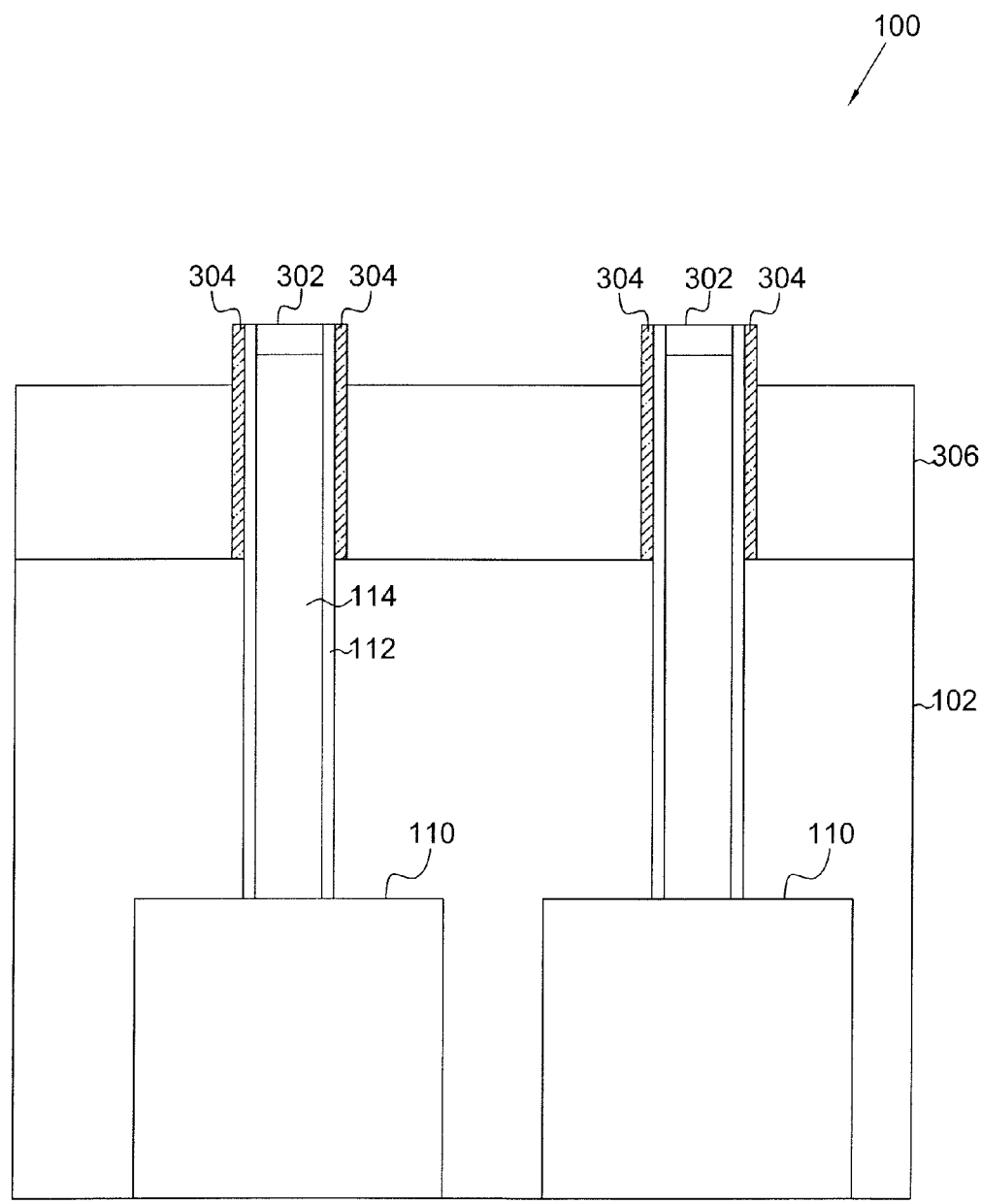
Figure 3B:
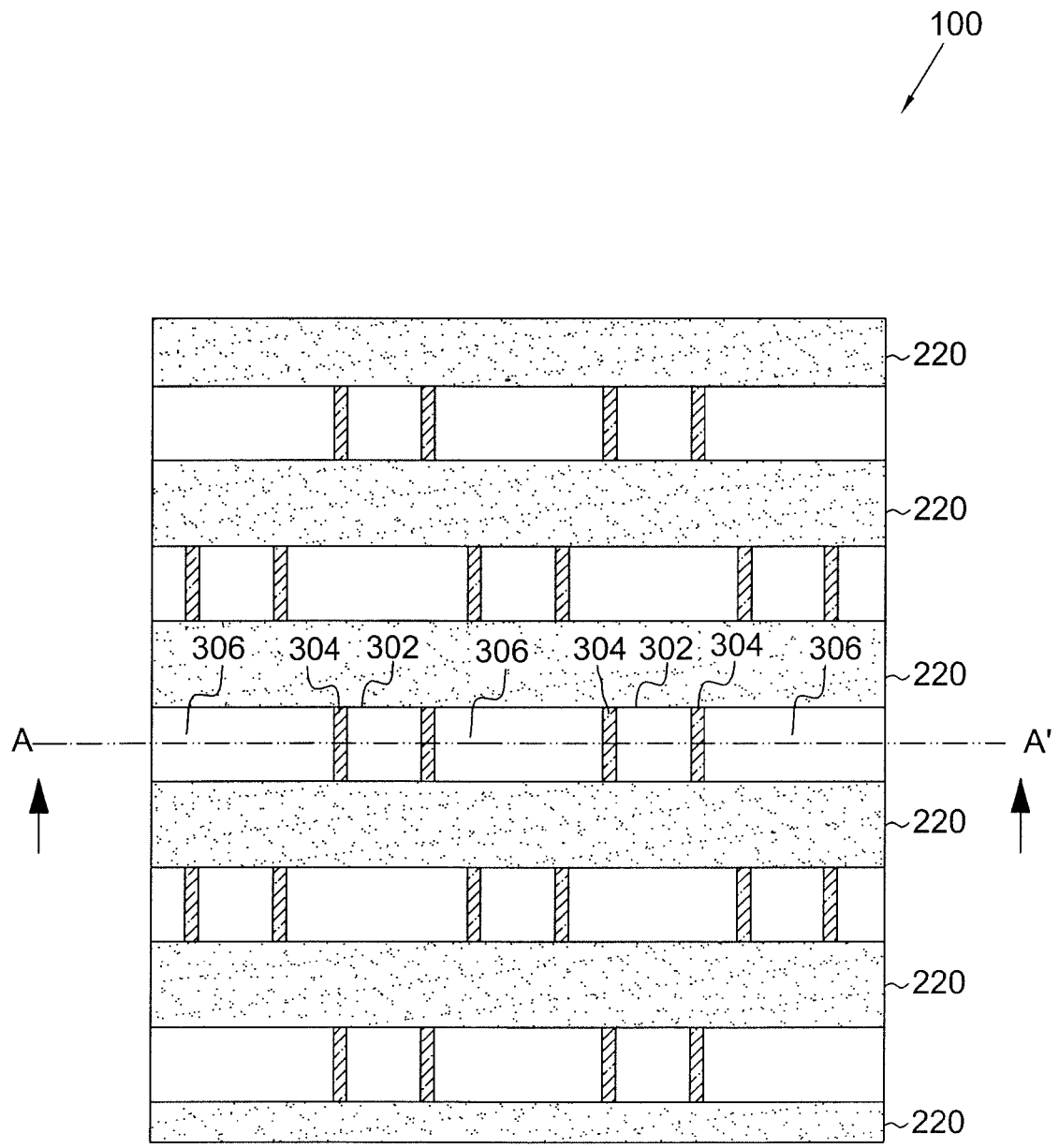

Then, conventional techniques, such as a chemical vapor deposition process, a lithography process, and an etching process, are implemented to form trench isolation layers 220 in the semiconductor substrate 100 to define active areas, as shown in FIG. 3B.

Referring to FIG. 3A and FIG. 3B, initially, the top surface of the conductive layer 114 in the trench 108 is oxidized to form an oxide layer 302 having a thickness of, for example, about 33 nm. Then, the pad nitride layer 104 is removed by using a wet etching process to expose an upper portion of the trench 108 and the top surface of the silicon base layer 102. Subsequently, a chemical deposition process is performed to conformally deposit a nitride liner layer having a thickness of, for example, about 7 nm, to cover the exposed upper portion of the trench 108 and the top surface of the silicon base layer 102. Then, a dry etching process is performed to partially remove the nitride liner layer on top of the silicon base layer 102 so that a spacer 304 is formed on the sidewall of the exposed upper portion of the trench 108. Afterwards, an epitaxial layer 306, having a thickness of, for example, about 100 nm, is formed on the silicon base layer 102 by utilizing an epitaxial growth method. The material of the epitaxial layer 306 can be, for example, silicon, germanium, or a compound semiconductor layer, and preferably, the material of the epitaxial layer 306 can be a single layer or multi-layer semiconductor layer depending on the device requirements. In the conventional process of forming a trench device, since the size of the device is defined by the lithography process, which is significantly affected by various parameters, the process window becomes smaller and the process control of defining the device size becomes more difficult when the size of the device is scaled down to the nano-level. Thus, in the embodiment of the present invention, an epitaxial growth method is performed for controlling the channel length of the vertical transistor, so that the ideal channel length of the vertical transistor can be accurately controlled by using epitaxial growth method. The present invention utilizes the deposition process to control the device size, which is advantageous over the conventional method by using the lithography process, and therefore is applicable to the manufacture of nano-level devices.

Figure 4A:
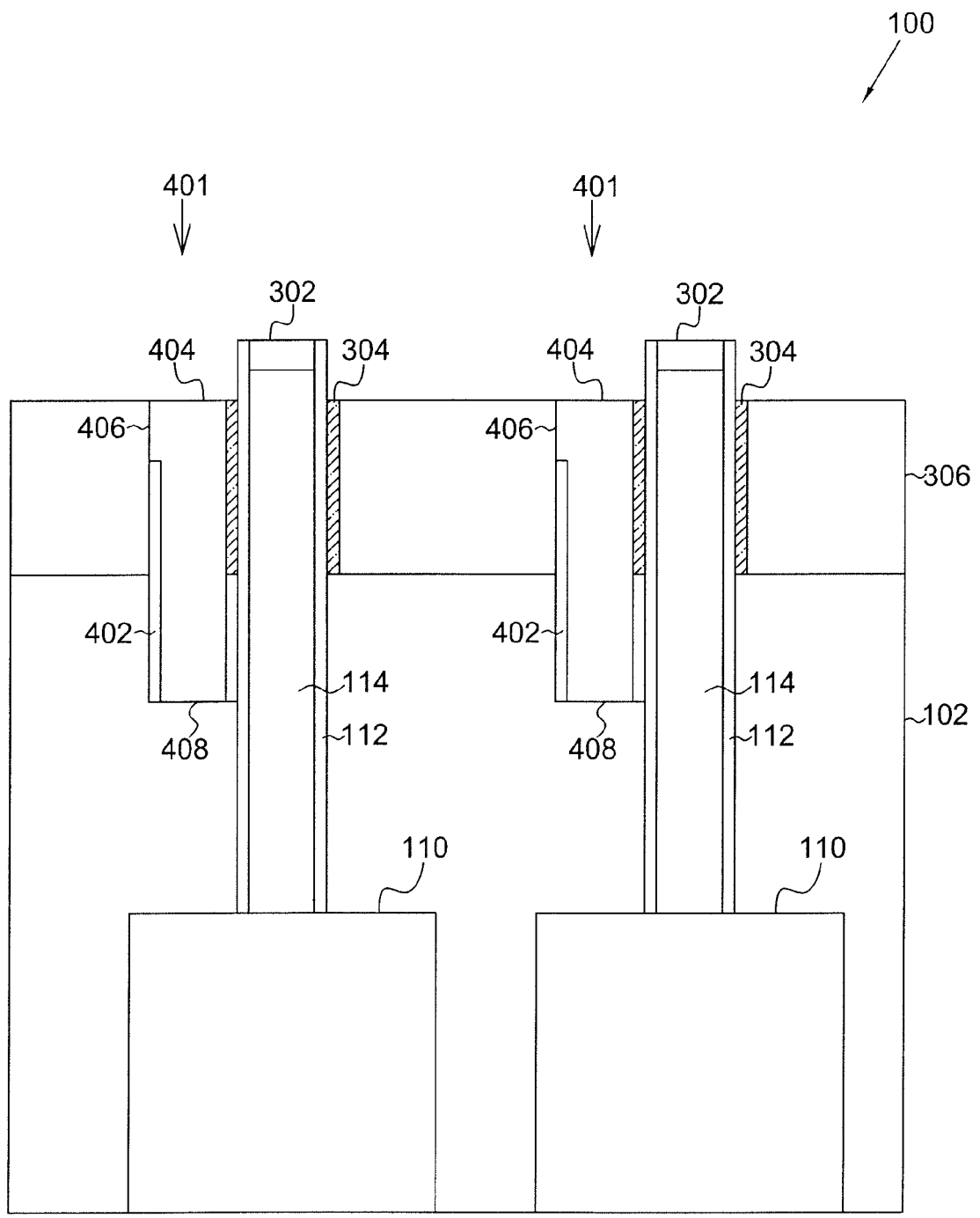
Figure 4B:
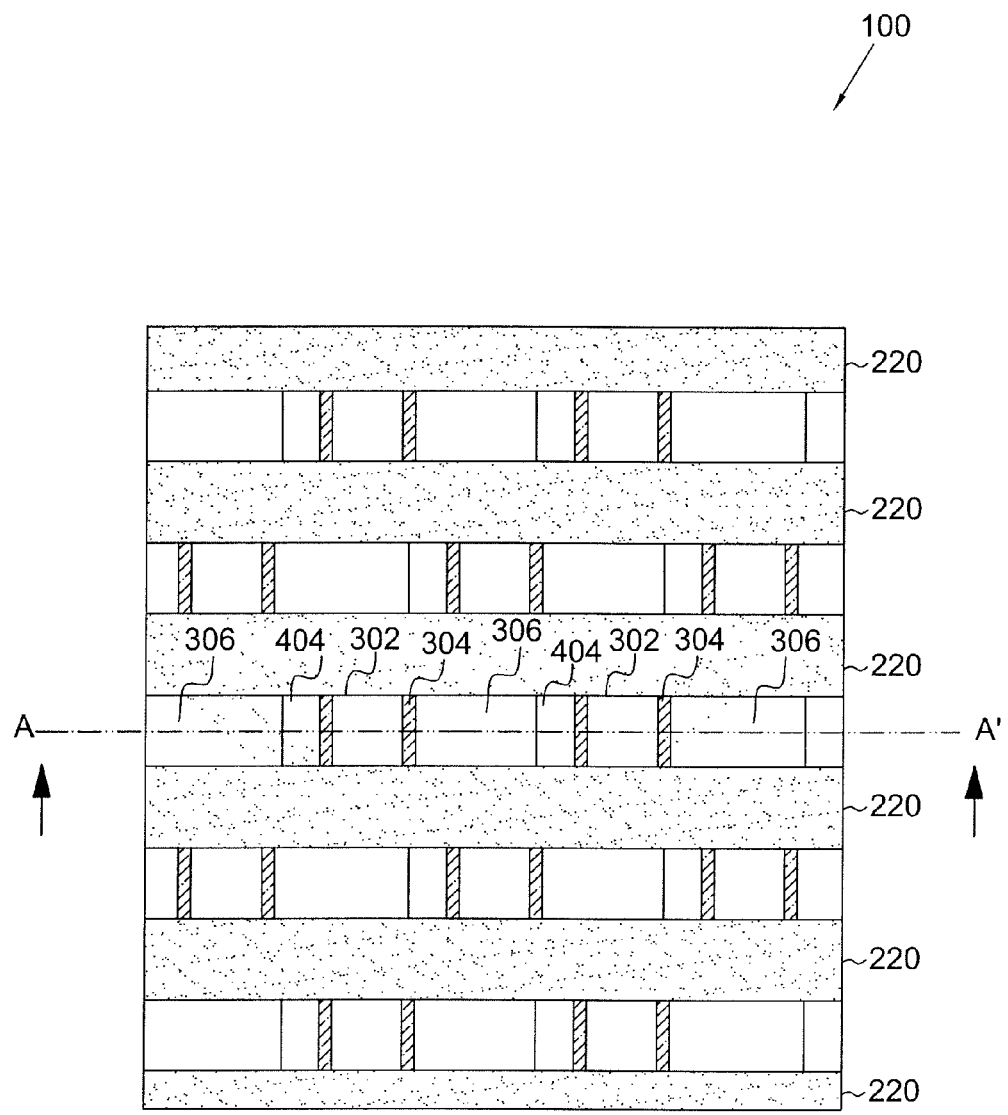

Referring to FIG. 4A and FIG. 4B, a lithography process is performed to define a doped channel array region (not shown) adjacent to the collar dielectric layer 112 in the semiconductor structure 100. Then, the epitaxial layer 306 and the silicon base layer 102 are etched to a predetermined depth (such as 220 nm) to partially expose a sidewall of the epitaxial layer 306 and a sidewall of the silicon base layer 102. Furthermore, in the doped channel array region, a substrate channel structure 401 having openings is formed adjacent to the trench 108 and is communicated with the silicon base layer 102 and the epitaxial layer 306 via the openings. The following description provides an exemplary embodiment of how the openings are formed. For example, an insulating layer 402 that is about 10 nm thick is formed on a portion of the exposed sidewall of the epitaxial layer 306 and on the exposed sidewall of the silicon base layer 102 by an oxidation process. Subsequently, an etching process (such as a dry etching process) is performed to remove portions of the insulating layer 402 to form openings so that the substrate channel structure 401 is able to respectively communicate with the silicon base layer 102 and the epitaxial layer 306. In this embodiment, the openings include a first opening 406 exposing a portion of the sidewall of the epitaxial layer 306, and a second opening 408 on a bottom of the substrate channel structure 401 to expose a portion of the silicon base layer 102. Furthermore, a doped channel layer 404 is filled in the doped channel array region, so that the substrate channel structure 401 is obtained. The substrate channel structure 401 includes the insulating layer 402 partially surrounding the doped channel layer 404, the first opening 406 and the second opening 408, so that the doped channel layer 404 is able to electrically connected to the epitaxial layer 306 via the first opening 406, and electrically connected to the silicon base layer 102 via the second opening 408. In this embodiment, the doped channel layer 404 is a P+ doped polysilicon layer with boron ions.

In another embodiment, the doped channel layer 404 may be filled in the substrate channel structure 401 after forming the insulating layer 402 and the second opening 408, and then a portion of the doped channel layer 404 and a portion of the insulating layer 402 are removed to form the first opening 406 by using an etching back method. Following this, a second deposition process is performed to complete the filling of the doped channel layer 404. Namely, it will be apparent to one skilled in the art that the specific details are not required in order to practice the invention, other variations may be made thereto without departing from the spirit and scope of the invention.

As described above, as the feature size of the device reduces, due to the connection between the doped channel layer 404 and the epitaxial layer 306, the accumulated charge can be transferred to the silicon base layer 102 through the doped channel layer 404 to avoid the floating body effect, which may further increase the quantity of the devices per area, such that the performance of the entire device is enhanced.

Figure 5A:
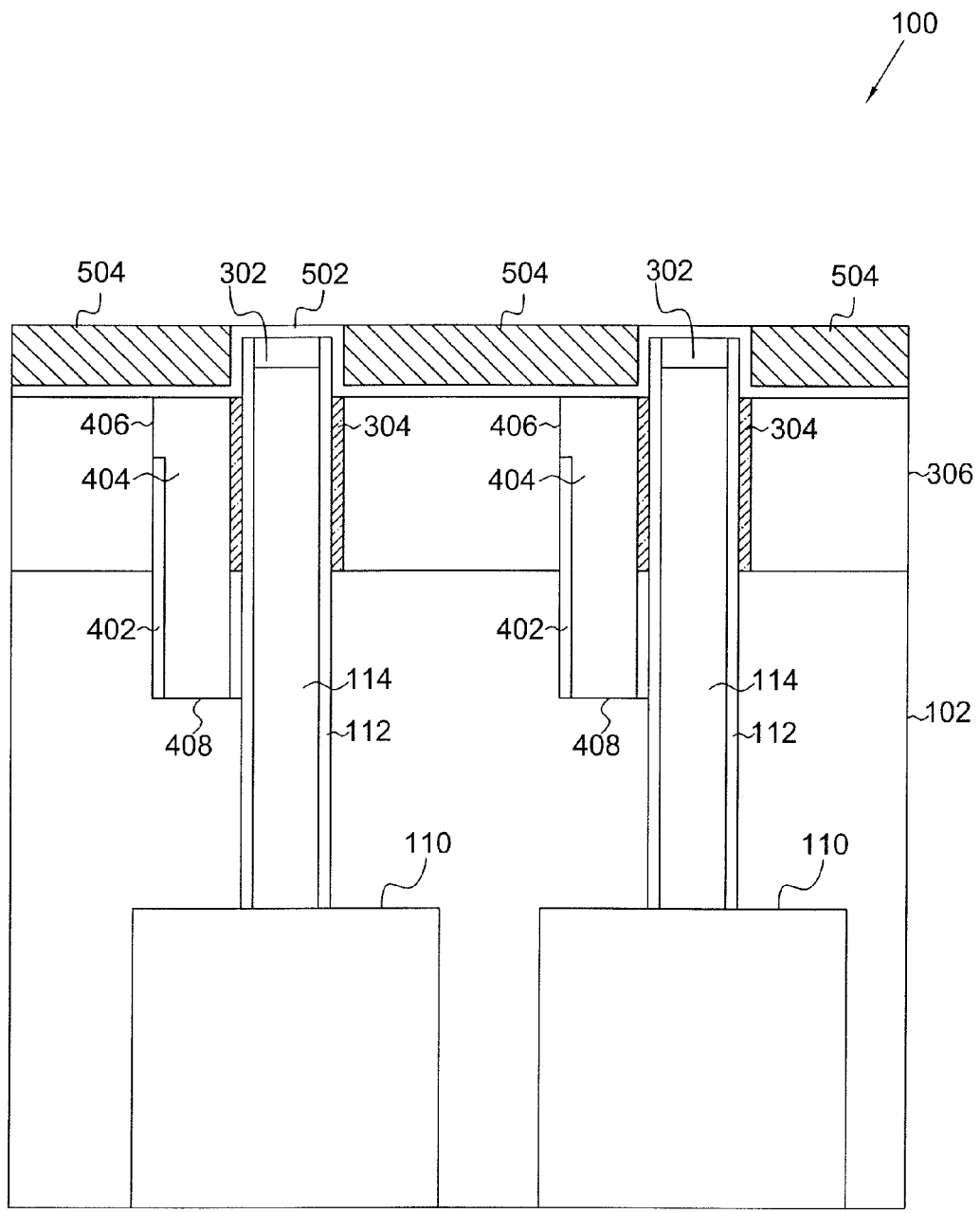
Figure 5B:
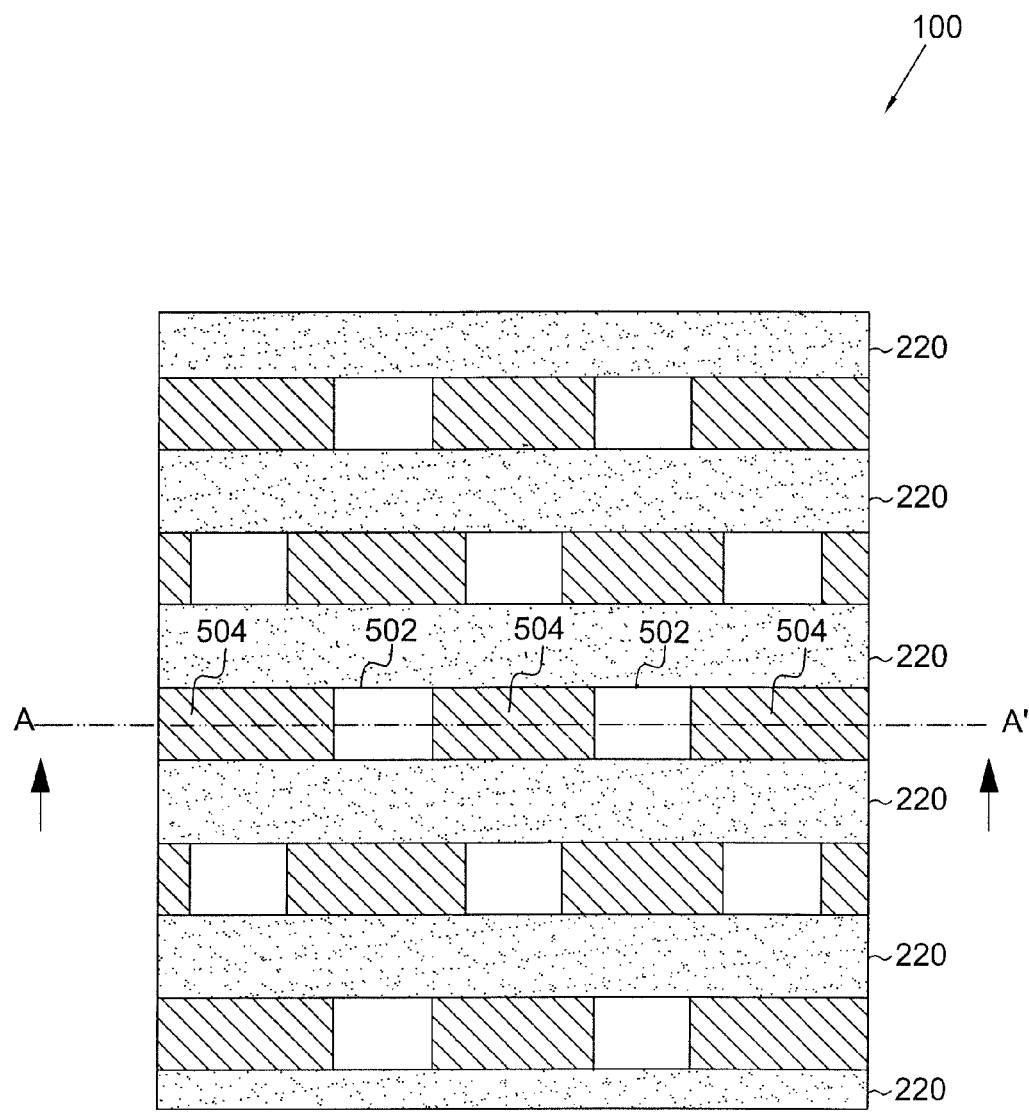

Referring now to FIG. 5A and FIG. 5B, a liner layer 502 is conformally deposited to cover the semiconductor substrate 100. In this embodiment, the liner layer 502 is, for example, a nitride layer that is about, for example, 8 nm thick. Then, a chemical deposition method is performed to form an oxide layer 504 so as to cover the semiconductor substrate 100. A chemical mechanical polishing process is performed to remove the oxide layer 504 till the liner layer 502 on the top of the trench 108 (as shown in FIG. 1) is exposed. In one embodiment, a sacrificial oxide layer having a thickness of about 5 nm may be formed before the step of forming the liner layer 502. Then, an ion implantation process is optionally performed to the silicon base layer 102 depending on the design of the processes and the device, wherein the process of the ion implantation process is well-known to a person skilled in the art and is not described in any further detail herein.

Figure 6A:
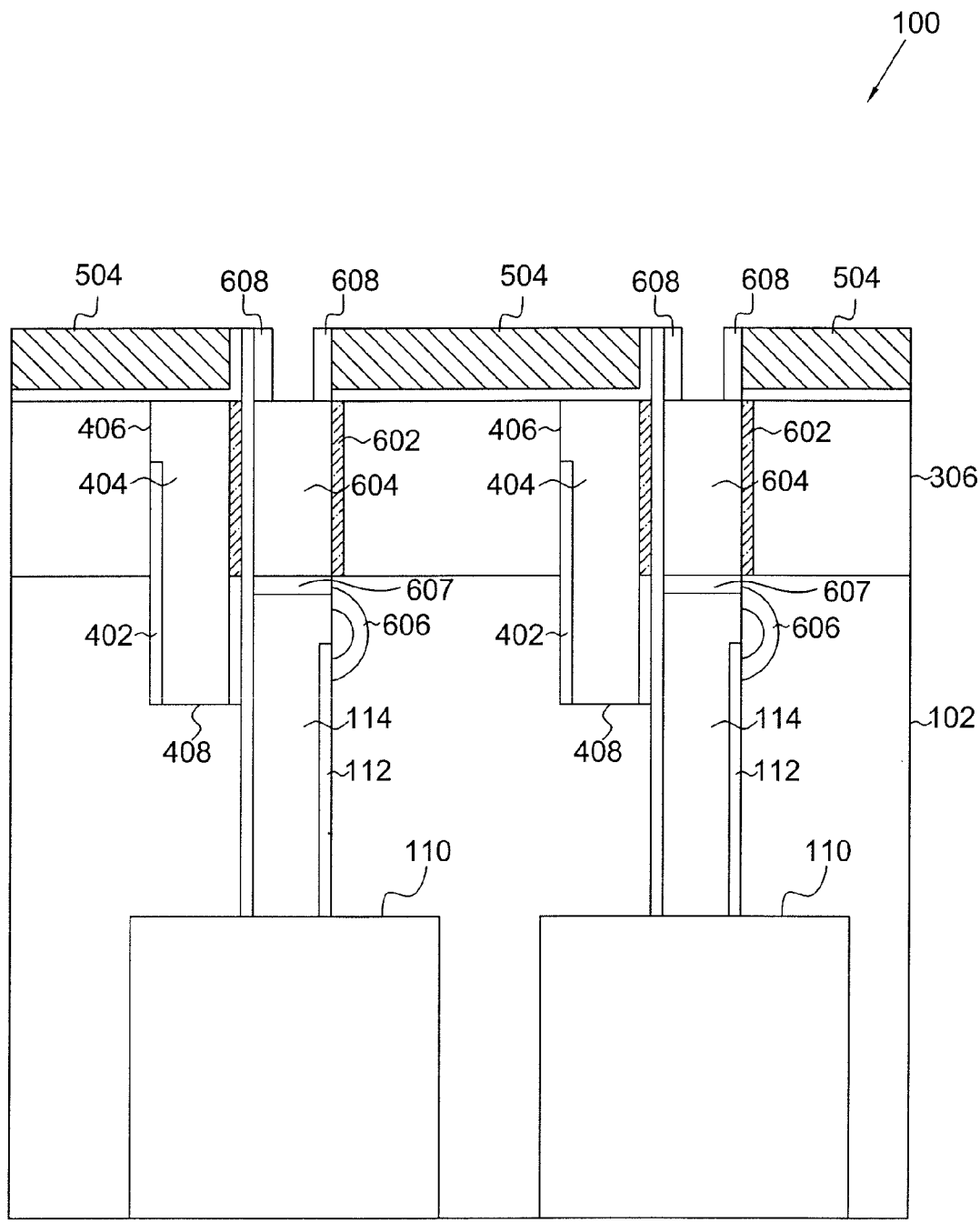
Figure 6B:
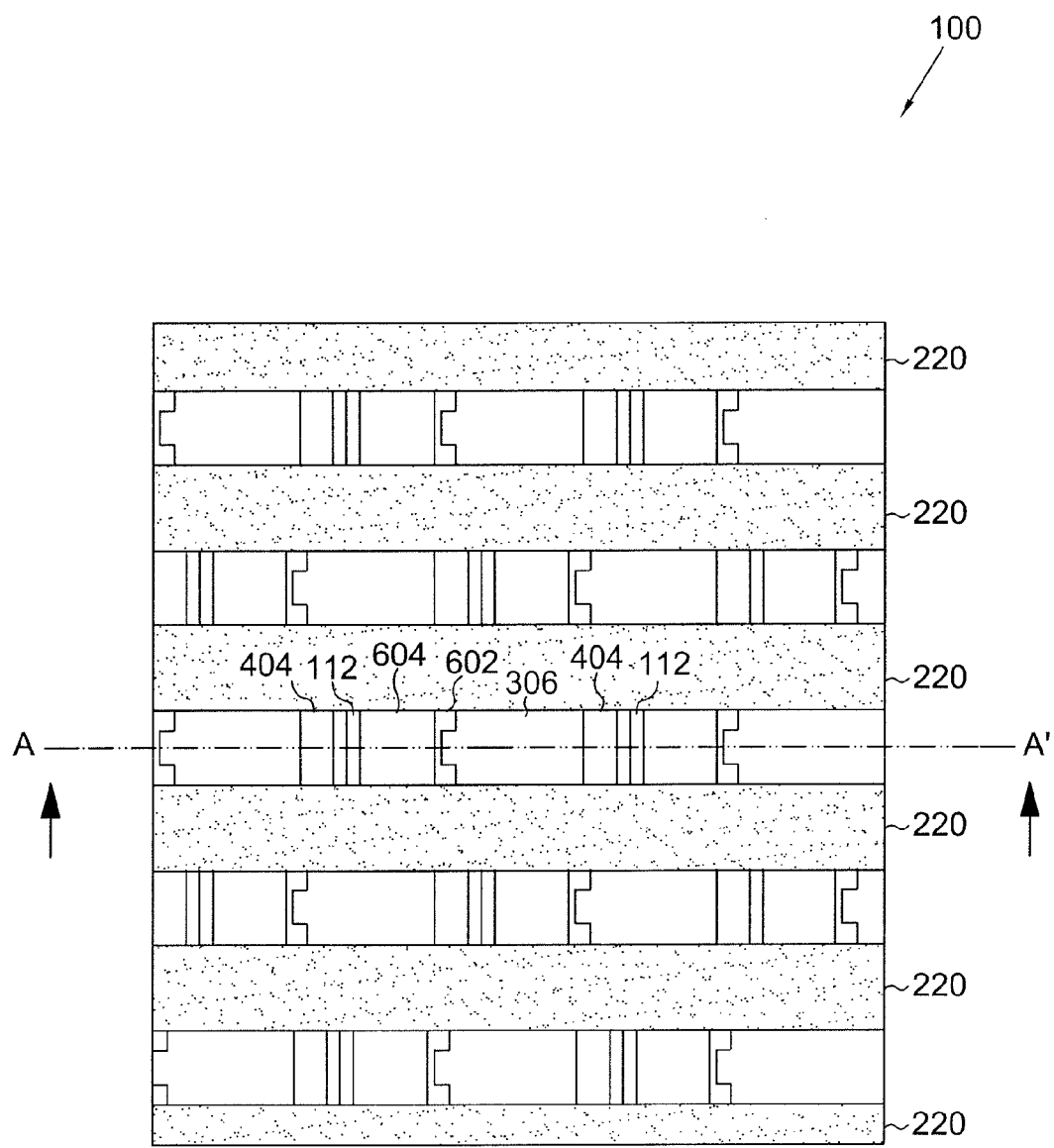

Referring to FIG. 6A and FIG. 6B, the liner layer 502, the oxide layer 302, and a portion of the conductive layer 114 is etched to a predetermined depth to expose a top surface of the conductive layer 114 in the trench 108, and then a single-sided buried strap structure 606 is formed by a conventional process, wherein the process of forming the single-sided buried strap structure 606 is well-known to a person skilled in the art and is not described in any further detail herein. Moreover, the conductive layer 114 is oxidized to form a top oxide layer 607 above the single-sided buried strap structure 606. Following this, the spacer 304 is removed by a wet etching process to expose the sidewall of the epitaxial layer 306, and then a gate dielectric layer 602 is formed on the exposed sidewall of the epitaxial layer 306 by a thermal oxidation process or a chemical vapor deposition process. For example, a thermal oxidation process is performed to form an oxide layer as the gate dielectric layer 602. Subsequently, a conductive layer 604 (such as a polysilicon layer) is filled in the trench 108, and then a portion of the conductive layer 604 is removed by using an etching back process, so that a recess is formed in the trench 108. A nitride layer, for example, (unshown) is conformally deposited to cover the semiconductor structure 100, and a portion of the nitride layer is removed by using a dry etching process, so that a spacer 608 having a thickness of about 150 Å is formed in the recess. The method of forming the single-sided buried strap structure 606 by an angled ion implantation is disclosed in Taiwan Patent No. 1232537 assigned to Nanya Technology Corporation, which is incorporated herein by reference.

In the conventional process, the single-sided buried strap structure 606 is formed after the step of forming the trench, and then the step of forming a trench isolation layer is performed. However, in one embodiment of the present invention, by adjusting the order of the processes, the trench isolation layer 202 is formed after the step of forming the trench, and then the single-sided buried strap structure 606 is formed after the step of forming the trench isolation layer 202, such that the single-sided buried strap structure 606 won't be subjected to a thermal process of about 1000° C. during the formation of the trench isolation layer 202. Therefore, the thermal budget of the process can be reduced, and the excessive diffusions of the doped ions can be avoided.

In this embodiment, an edge trimming process may be performed before forming the gate dielectric layer 602. For example, a portion of the epitaxial layer 306 may be etched using a hydrogen fluoride/ethylene glycol (HF/EG) solution, and then a sidewall of the exposed epitaxial layer 306 is oxidized by a thermal oxidation process, so that the gate dielectric layer 602 with a curved corner is formed. Thus, the gate dielectric layer 602 having a reversed U-shaped cap structure can slightly cover the epitaxial layer 306, so that the electric current through the epitaxial layer 306 can be increased (i.e. the depletion region is increased), as shown in FIG. 6B (FIG. 6B is simplified for illustrating the shape of the gate dielectric layer 602).

In the conventional process, the process of forming the trench isolation layer is performed after the formation of the vertical transistor, wherein the vertical transistor is formed on the trench, so that the gate dielectric layer 602 may be damaged in the isolation process resulting in the current leakage. In an embodiment of the present invention, the process of forming the vertical transistor is performed after the process of forming the trench isolation layer 220, so that the damage of the gate dielectric layer 302 can be avoid and the reliability of the device can be enhanced.

Figure 7:
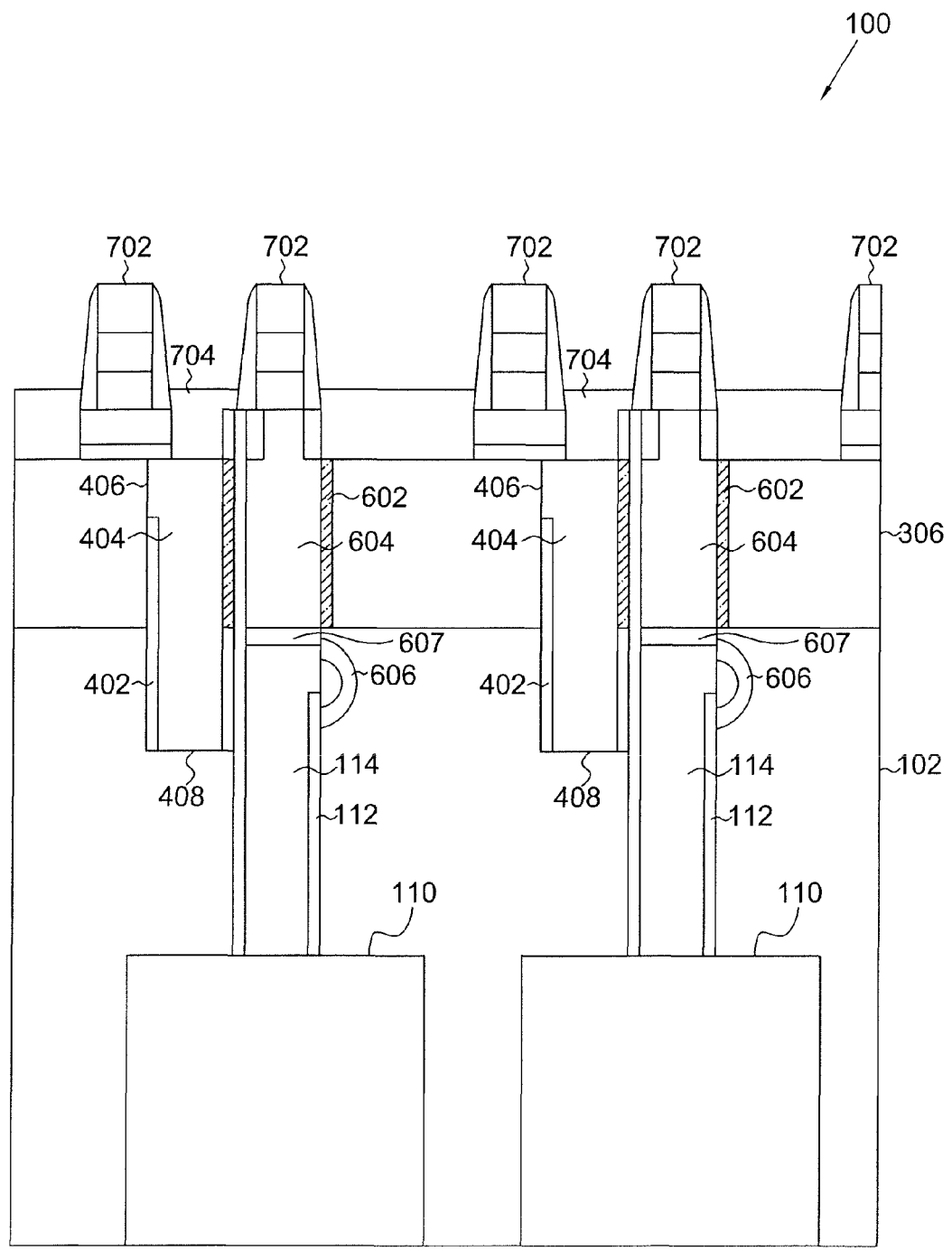
FIG. 7 illustrates the steps of forming a word line and a bit line on the semiconductor substrate in accordance with one exemplary embodiment of the present invention.

Subsequently, a word line 702 and a source 704 are formed above the silicon base layer 102, as shown in FIG. 7. The word line 702 and the source 704 can be formed by conventional processes and are not described in any further detail herein.

Although specific embodiments have been illustrated and described, it will be obvious to those skilled in the art that various modifications may be made without departing from what is intended to be limited solely by the appended claims.

What is claimed is:

1. A trench-type semiconductor device structure, comprising:
   a semiconductor substrate with a trench, said trench having an upper portion and a lower portion, wherein said upper portion has a conductive layer filled therein and said lower portion has a trench capacitor formed therein;
   a gate dielectric layer located between said semiconductor substrate and said conductive layer, and formed on a first side of said trench; and
   a substrate channel structure with openings formed on a second side of said trench opposite to said first side and adjacent to said trench, said substrate channel structure being electrically connected to said semiconductor substrate via said openings.

2. The trench-type semiconductor device structure of claim 1, wherein said semiconductor substrate comprises a silicon base layer and an epitaxial layer on said silicon base layer.

3. The trench-type semiconductor device structure of claim 1, wherein said openings comprise a first opening defined in a sidewall of said substrate channel structure, and a second opening defined in a bottom of said substrate channel structure.

4. The trench-type semiconductor device structure of claim 1, wherein said openings comprise a first opening defined in a sidewall of said substrate channel structure, and a second opening defined in a bottom of said substrate channel structure, said semiconductor substrate comprises a silicon base layer and an epitaxial layer on said silicon base layer, said substrate channel structure is electrically connected to said epitaxial layer via said first opening, and said substrate channel structure is electrically connected to said silicon base layer via said second opening.

5. The trench-type semiconductor device structure of claim 1, wherein said substrate channel structure comprises a doped channel layer and an insulating layer around said doped channel layer.

6. The trench-type semiconductor device structure of claim 4, wherein said substrate channel structure comprises a doped channel layer and an insulating layer around said doped channel layer.

7. The trench-type semiconductor device structure of claim 1, wherein said gate dielectric layer has a curved corner.

8. The trench-type semiconductor device structure of claim 1, wherein said gate dielectric layer has a U-shaped cap structure.

9. The trench-type semiconductor device structure of claim 2, wherein said epitaxial layer is a semiconductor compound layer.

* * * * *